(12) United States Patent
Ho et al.

(10) Patent No.: US 11,201,386 B2
(45) Date of Patent: Dec. 14, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW); Chun Chen Chen, Kaohsiung (TW); Yuanhao Yu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 15 days.

(21) Appl. No.: 16/670,487

(22) Filed: Oct. 31, 2019

(65) Prior Publication Data
US 2021/0135333 A1 May 6, 2021

(51) Int. Cl.
| | | |
|---|---|---|
| *H01L 23/495* | (2006.01) | |
| *H01L 21/786* | (2006.01) | |
| *H01Q 1/22* | (2006.01) | |
| *H01L 23/28* | (2006.01) | |
| *H01L 21/768* | (2006.01) | |
| *H01L 23/66* | (2006.01) | |

(52) U.S. Cl.
CPC ..... *H01Q 1/2283* (2013.01); *H01L 21/76801* (2013.01); *H01L 23/28* (2013.01); *H01L 23/4952* (2013.01); *H01L 23/66* (2013.01)

(58) Field of Classification Search
CPC ..... H01L 23/28; H01L 23/66; H01L 23/4952; H01L 21/76801
See application file for complete search history.

(56) References Cited

U.S. PATENT DOCUMENTS

| | | | |
|---|---|---|---|
| 10,096,558 B1 * | 10/2018 | Chiang | .............. H01L 23/66 |
| 2015/0194388 A1 * | 7/2015 | Pabst | .............. H01L 23/3128 |
| | | | 257/659 |
| 2019/0279951 A1 | 9/2019 | Chiang et al. | |

* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

A semiconductor device package and a method for manufacturing the same are provided. The semiconductor device package includes a circuit layer and an antenna module. The circuit layer has a first surface, a second surface opposite to the first surface and a lateral surface. The lateral surface extends between the first surface and the second surface. The circuit layer has an interconnection structure. The antenna module has an antenna pattern layer and is disposed on the first surface of the circuit layer. The lateral surface of the circuit layer is substantially coplanar with a lateral surface of the antenna module.

23 Claims, 26 Drawing Sheets

SEMICONDUCTOR DEVICE PACKAGE AND METHOD FOR MANUFACTURING THE SAME

TECHNICAL FIELD

The present disclosure relates to a semiconductor device package and a method of manufacturing the same, and to a semiconductor device package including an antenna module and a method of manufacturing the same.

BACKGROUND

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry.

In a comparative wireless communication device, antennas and circuits (e.g., radio reference (RF) circuits or digital circuits) are disposed on a printed circuit board (PCB) or a substrate. However, it is difficult to fine tune the antennas. In addition, the overall size of the wireless communication device is large and thus it is inflexible in the design of the radio frequency (RF).

SUMMARY

In accordance with some embodiments of the present disclosure, a semiconductor device package is provided. The semiconductor device package includes a circuit layer, an antenna module, a metal pillar and an encapsulant. The circuit layer has a first surface, a second surface opposite to the first surface. The antenna module has an antenna pattern layer and is disposed on the first surface of the circuit layer. The metal pillar is electrically connected between the antenna pattern layer and the first surface of the circuit layer. The encapsulant covers at least a portion of a lateral surface of the metal pillar. The passivation layer is disposed between the encapsulant and the antenna pattern layer.

In accordance with some embodiments of the present disclosure, a semiconductor device package is provided. The semiconductor device package includes an encapsulant, a circuit layer, and an antenna pattern layer. The encapsulant has a first surface and a second surface opposite to the first surface. The circuit layer is disposed on the first surface. The antenna pattern layer is disposed on the second surface. The encapsulant has a recess from the first surface.

In accordance with some embodiments of the present disclosure, a method for manufacturing a semiconductor device is provided. The method includes: forming an antenna pattern layer; forming a conductive pillar on the antenna pattern layer; forming an encapsulant to cover the conductive pillar and expose a top surface of the conductive pillar; forming a ground layer on the top surface of the conductive pillar exposed from the encapsulant; and forming a circuit layer on the ground layer.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

DETAILED DESCRIPTION

The present disclosure provides for a semiconductor device package and a method for manufacturing the same. Embodiments of semiconductor device packages and methods described herein provide some semiconductor device packages to decrease the thickness of the semiconductor device package. The design of the semiconductor device package of the present disclosure can increase the flexibility of RF design. In the semiconductor device package of the present disclosure, a seal or a printed circuit board or a package substrate may be omitted, and thus it can achieve better X/Y dimension tolerance. The design of the semiconductor device package of the present disclosure can shorten the RF and single transmission path. The chip last design of the semiconductor device package can increase the yield rate.

Figure 1:
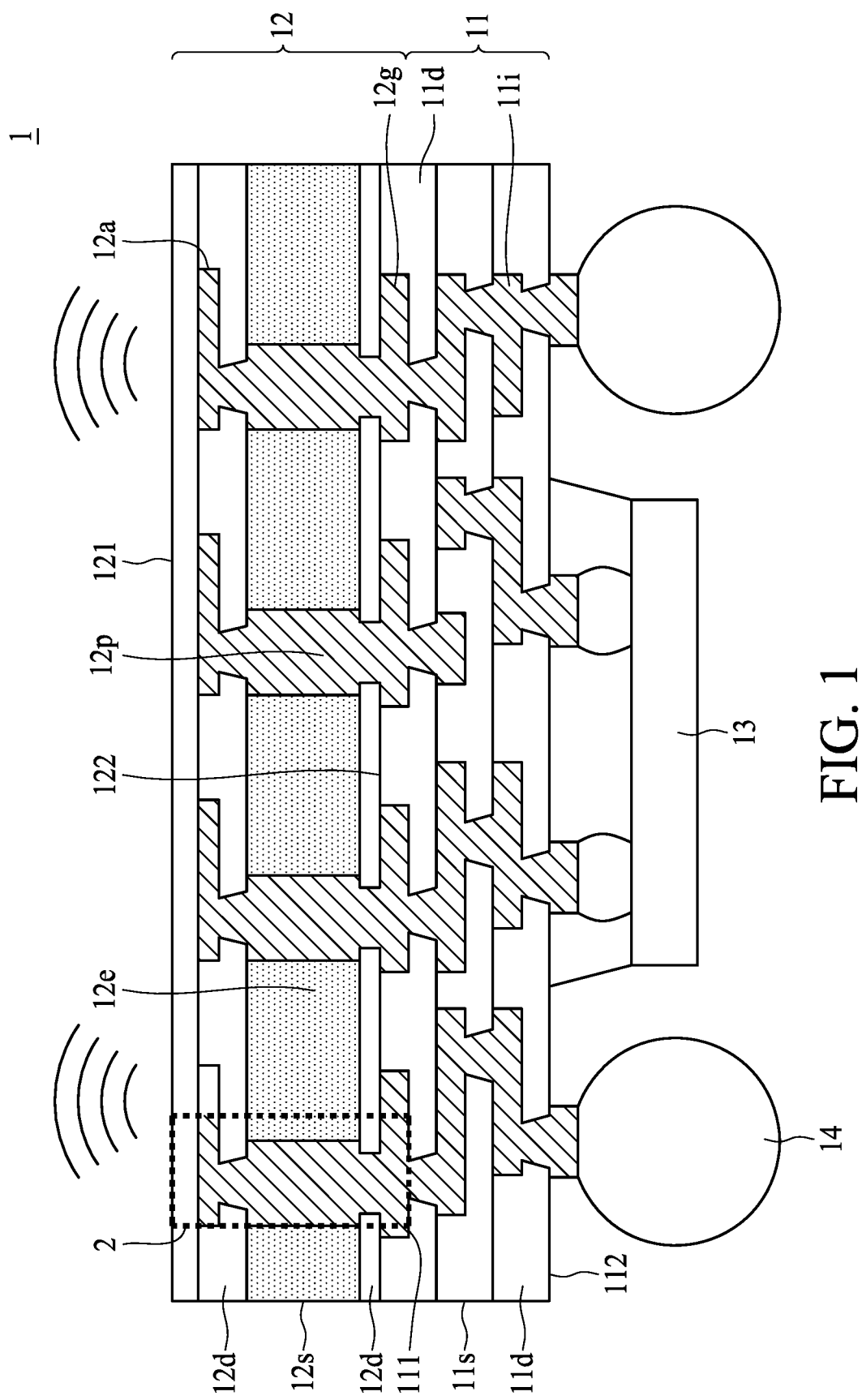
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a circuit layer 11, and an antenna module 12, an electronic component 13 and an electrical contact 14. In some embodiments, the semiconductor device package 1 may be a wireless communication device or parts of a wireless communication device.

The circuit layer 11 has a surface 111, a surface 112, and a lateral surface 11s. The surface 112 is opposite to the surface 111. The lateral surface 11s extends between the surface 111 and the surface 112. The circuit layer 11 has an interconnection structure 11i (or electrical connection), such as a redistribution layer (RDL). The circuit layer 11 includes a dielectric layer 11d. A portion of the interconnection layer 11i is covered or encapsulated by the dielectric layer 11d while another portion of the interconnection layer 11i is exposed from the dielectric layer 11d to provide electrical connections. In some embodiments, the dielectric layer 11d may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 11d may include an inorganic material, such as silicon, a ceramic or the like. In some embodiments, there may be any number of interconnection layers 11i depending on design specifications. The circuit layer 11 may include one or more conductive pads in proximity to, adjacent to, or embedded in and exposed at the surface 112 or 111 of the circuit layer 11.

The antenna module 12 is disposed on the surface 111 of the circuit layer 11 and electrically connected to the circuit layer 11. In some embodiments, the antenna module 12 is in contact with the circuit layer 11. For example, there is no gap between the antenna module 12 and the circuit layer 11. The antenna module 12 has a surface 121, a surface 122, and a lateral surface 12s. The surface 122 is opposite to the surface 121. The lateral surface 12s extends between the surface 121 and the surface 122. The lateral surface 11s of the circuit layer 11 is substantially coplanar with a lateral surface 12s of the antenna module 12. In some embodiments, the antenna module 12 has an antenna pattern layer 12a, a ground layer 12g, a metal pillar 12p, an encapsulant 12e and a passivation layer 12d. The antenna pattern layer 12a is disposed adjacent to the surface 121 of the antenna module 12. The ground layer 12g is disposed adjacent to the surface 122 of the antenna module 12. The ground layer 12g of the antenna module 12 is in contact with the first surface 111 of the circuit layer 11. The ground layer 12g of the antenna module 12 is electrically connected to the circuit layer 11.

The antenna pattern layer 12a is, or includes, a conductive material such as a metal or metal alloy. Examples of the conductive material include gold (Au), silver (Ag), aluminum (Al), copper (Cu), or an alloy thereof. In some embodiments, the antenna pattern layer 12a may include a single antenna element. In some embodiments, the antenna pattern layer 12a may include multiple antenna elements. For example, the antenna pattern layer 12a may include an M×N array of antenna elements, where M or N is an integer greater than 1. In some embodiments, M can be the same as or different from N depending on design specifications. In some embodiments, the antenna pattern layer 12a may be a patch antenna, a dipole antenna, a horn antenna, a loop antenna, a planar inverted F antenna (PIFA) or any other antennas.

In some embodiments, the ground layer 12g is in contact with the circuit layer 11. For example, there is no gap between the ground layer 12g and the circuit layer 11. For example, the ground layer 12g may be covered by the dielectric layer 11d of the circuit layer 11. The ground layer 12g is, or includes, a conductive material such as a metal or metal alloy. Examples of the conductive material include Au, Ag, Al, Cu, or an alloy thereof.

The metal pillar 12p (e.g., Cu pillar) is electrically connected between the antenna pattern layer 12a and the ground layer 12g. For example, the metal pillar 12p penetrate the encapsulant 12e to electrically connect the antenna pattern layer 12a with the ground layer 12g. In some embodiments, the metal pillar 12 is electrically connected to a feeding point of the antenna pattern layer 12a for signal transmission between the antenna pattern layer 12a and the ground layer 12g and/or other electronic components (e.g., RF circuits, passive elements or circuit boards). In some embodiments, the number of the metal pillar 12 can be adjusted depending on different design specifications.

The encapsulant 12e is disposed between the antenna pattern layer 12a and the ground layer 12g. The encapsulant 12e covers at least a portion of a lateral surface of the metal pillar 12p and exposes the upper surface and the bottom surface of the metal pillar 12 for electrical connections. The encapsulant 12e includes a material having a relatively low dielectric constant. In some embodiments, the encapsulant 12e includes an epoxy resin having fillers, a molding compound (e.g., an epoxy molding compound or other molding compound), a polyimide, a phenolic compound or material, a material with a silicone dispersed therein, or a combination thereof.

The passivation layer 12d is disposed on both surfaces (e.g., a top surface and a bottom surface) of the encapsulant 12e. The passivation layer 12d covers at least a portion of the antenna pattern layer 12a and the ground layer 12g. In some embodiments, the passivation layer 12d includes materials having relatively low Dk and Df. For example, the passivation layer 12d may include a dielectric material or a photosensitive material, such as polyimide (PI).

The electronic component 13 is disposed on the surface 112 of the circuit layer 11 and electrically connected to the circuit layer 11 (e.g., to the interconnection structure 11i of the circuit layer 11). In some embodiments, the antenna module 12 is electrically connected to the antenna module 12 through the interconnection structure 11i within the circuit layer 11. In other embodiments, the electronic component 13 may be electrically connected to the antenna module 12 through electromagnetic coupling. The electronic component 13 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. For example, the electronic component 13 may include a RF circuit, a digital circuit and/or a mixed-signal circuit. In some embodiments, the number or the type of the electronic components 13 can be changed depending on different design specifications.

The electrical contact 14 (e.g. a solder ball) is disposed on the surface 112 of the circuit layer 11 and electrically connected to the circuit layer 11 (e.g., to the interconnection structure 11i of the circuit layer 11). The electrical contact 14 can provide electrical connections between the semiconductor device package 1 and external components (e.g. external circuits or circuit boards). In some embodiments, the electrical contact 14 includes a controlled collapse chip connection (C4) bump, a ball grid array (BGA) or a land grid array (LGA).

In some comparative wireless communication devices, RF and digital circuits are disposed on a PCB or a substrate, and antenna patterns are formed on the PCB or the substrate. However, if the performance of the antenna patterns cannot achieve the desired specifications, it is difficult to adjust (fine-tune) the performance of the antenna patterns. In addition, the entire wireless communication device would be determined to be failure, even if one of the antennas or the circuits fails, which would reduce the yield rate for manufacturing the wireless communication device. In accordance with the embodiment as shown in FIG. 1, the antenna module 12 is a separated module, and the performance of the antenna module 12 can be adjusted (fine-tune). Additionally, if one of the antenna module 1 or the electronic component 21 has a defect, they can be changed or substituted individually. This can increase the yield rate for manufacturing the wireless communication device. Furthermore, in accordance with the embodiment as shown in FIG. 1, the antenna module 12 is unnecessary to be mounted on a seal or a printed circuit board or a package substrate. Accordingly, the overall thickness of the semiconductor device package in accordance with the embodiments of the present disclosure can be reduced.

In addition, since the antenna module 12 directly contact the circuit layer 11, the transmission path between the antenna module 12 and the circuit layer 11 (or between the antenna module 12 and the electronic component 13) is shortened. This can reduce the transmission loss of the signal transmitted between the antenna module 12 and the circuit layer 11 (or between the antenna module 12 and the electronic component 13), and in turn improve the performance of the semiconductor device package 1.

Figure 2:
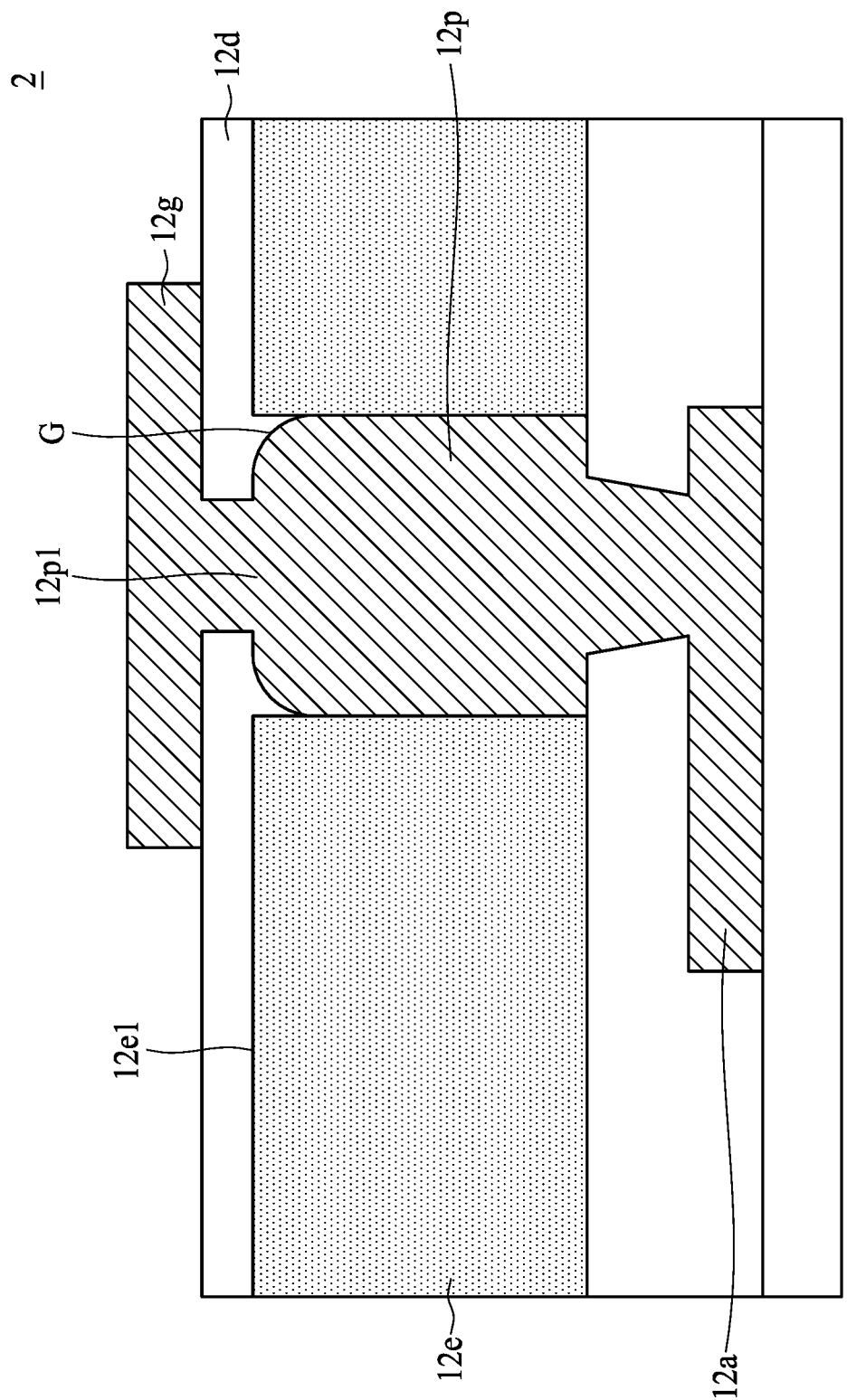
FIG. 2 illustrates a cross-sectional view of a portion of a semiconductor device package in accordance with some embodiments of the present disclosure.

FIG. 2 illustrates a cross-sectional view of a portion of a semiconductor device package in accordance with some embodiments of the present disclosure. For example, the structure shown in FIG. 2 is an enlarged view of a portion 2 of a semiconductor device package 1 shown in FIG. 1 encircled by a dotted-line rectangle.

Referring to FIG. 2, the metal pillar 12p has a surface 12p1 adjacent to the ground layer 12g. In some embodiments, the surface 12p1 is nonplanar. For example, a portion of the surface 12p1a portion of the surface 12p1 of the metal pillar 12p is recessed from a surface 12e1 of the encapsulant 12e facing the circuit layer 11. The portion of the surface 12p1 of the metal pillar 12p has a curved surface. The curved surface is located adjacent to an interface between the metal pillar 12p and the encapsulant 12e. A gap G is defined between the encapsulant 12e and the metal pillar 12p. The gap G is filled by the passivation layer 12d.

The passivation layer 12d of the antenna module 12 covers a portion of the encapsulant 12e and a portion of the metal pillar 12p. For example, the passivation layer 12d covers the surface 12e1 of the encapsulant 12e and the surface 12p1 of the metal pillar 12p. The passivation layer 12d is disposed within the gap G. The passivation layer 12d covers the curved surface of the metal pillar 12p.

Because the portion of the surface 12p1 of the metal pillar 12p has a curved surface, it is allowed the antenna module 12 to alleviate/mitigate/reduce/avoid parasitic effects. Because the surface 12p1 of the metal pillar 12p has relatively less surface roughness, it can improve RF transmission loss issue of the antenna module 12.

Figure 3:
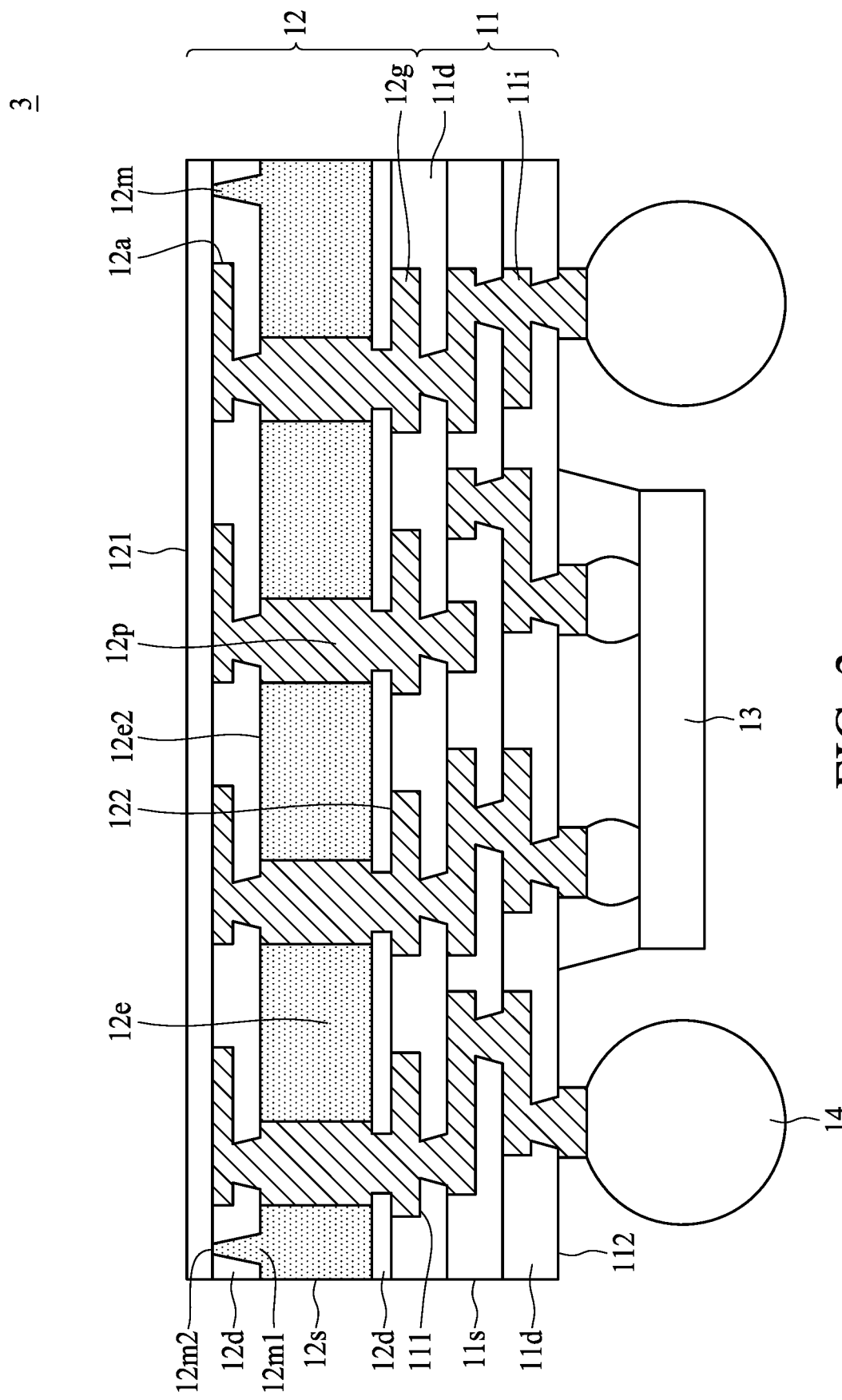
FIG. 3 illustrates a cross-sectional view of a semiconductor device package 3 in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1 and the differences therebetween are described below.

The encapsulant 12e has a protruding portion 12m protruded from the surface 12e2 of the encapsulant 12e. The protruding portion 12m extends to the passivation layer 12d. The protruding portion 12m has a surface 12m1 and a surface 12m2. The surface 12m1 is in contact with the surface 12e2. The surface 12m1 is opposite to the surface 12e2. As shown in FIG. 3. The width of the surface 12m1 is greater than the width of the surface 12m2. In some embodiments, there may be a plurality of protruding portions arranged in a molding lock structure, and the number of the protruding portions can be adjusted or changed depending on different design specifications. The protruding portions of the encapsulant can increase the connection reliability/stability of the semiconductor device package 3.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N illustrate a method for manufacturing a semiconductor device in accordance with some embodiments of the present disclosure. In some embodiments, the method in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N can be used to manufacture the semiconductor device package 1 as shown in FIG. 1. In other embodiments, the method in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N can be used to manufacture other semiconductor device package.

Figure 4A:
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N illustrate a method for manufacturing a semiconductor device in accordance with some embodiments of the present disclosure.

Referring to FIG. 4A, a carrier 401 is provided. In some embodiments, the carrier 401 has an adhesive layer (e.g., tape or adhesive film) disposed on the carrier 401. The material of the carrier 401 can be determined depending on different design specifications. In some embodiments, the material of the carrier may include glass. A passivation layer 402 (e.g., corresponding to the passivation layer 12d in FIG. 1) is formed/disposed on the carrier 401.

Figure 4B:
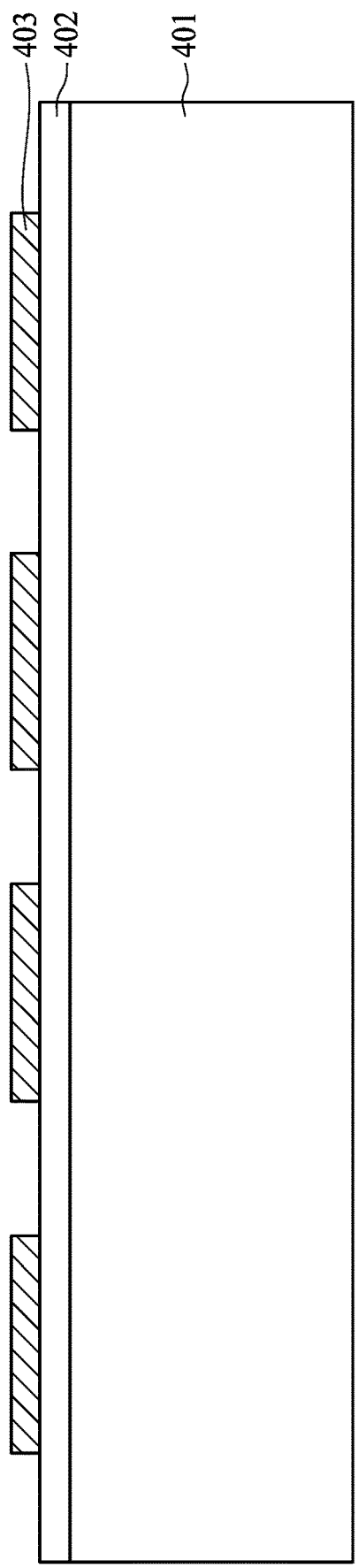

Referring to FIG. 4B, an antenna pattern layer 403 (e.g., corresponding to the antenna pattern layer 12a in FIG. 1) is formed on the passivation layer 402. The antenna pattern layer 403 covers a portion of the passivation layer 402. The antenna pattern layer 403 has one or more openings to expose a portion of the passivation layer 402.

Figure 4C:
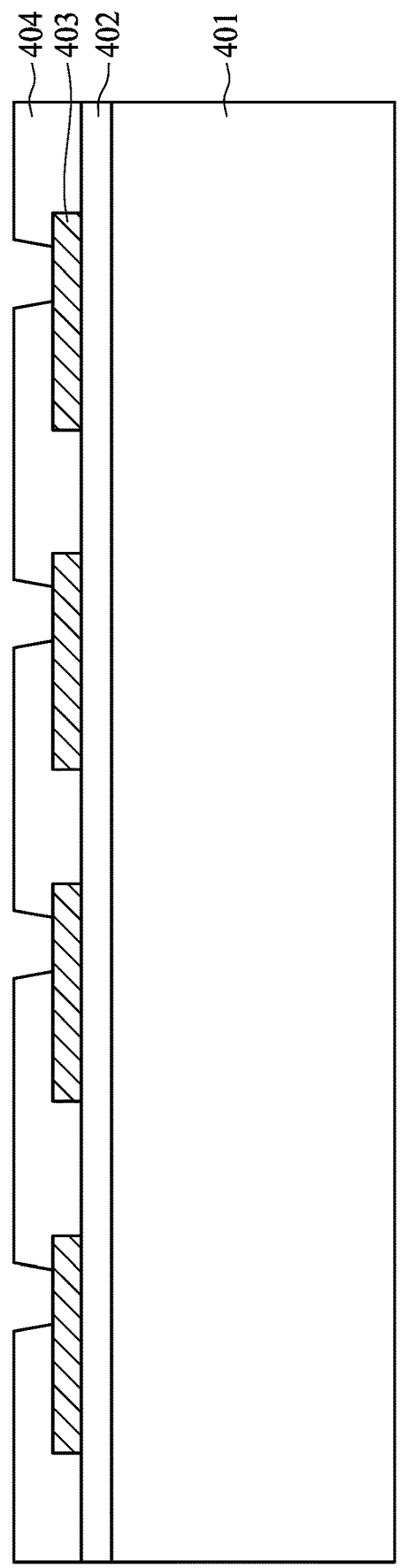

Referring to FIG. 4C, a passivation layer 404 is formed on the antenna pattern layer 403 and within the openings to contact the passivation layer 401 exposed from the antenna pattern layer 403. The passivation layer 404 has one or more openings to expose a portion of the antenna pattern layer 403. Each of the openings of the passivation layer 404 has a first surface in contact with the antenna pattern layer 403 and a second surface opposite to the first surface. As shown in FIG. 4C, the width of the second surface is greater than the width of the first surface of the openings of the passivation layer 404.

Figure 4D:
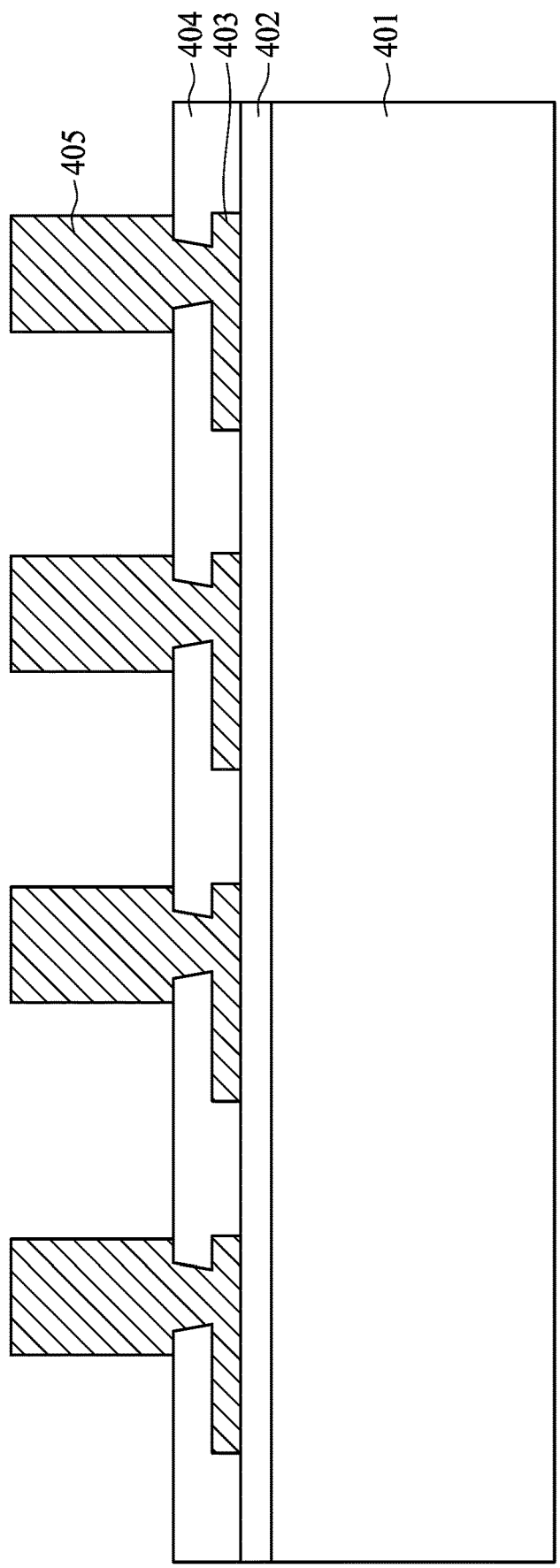

Referring to FIG. 4D, a metal pillar 405 (e.g., corresponding to the antenna metal pillar 12p in FIG. 1) is formed on the antenna pattern layer 403 exposed from the passivation layer 404. In consideration of the impedance matching, height and the size of feed point of the metal pillar 405, the opening for contacting the antenna pattern layer 403 and the metal pillar 405 will be limited. Therefore, a smaller opening can be defined by a passivation layer (e.g., a PI layer), and a wider opening can be defined by photoresist such that the metal pillar 405 can be filled into the wider opening.

Figure 4E:
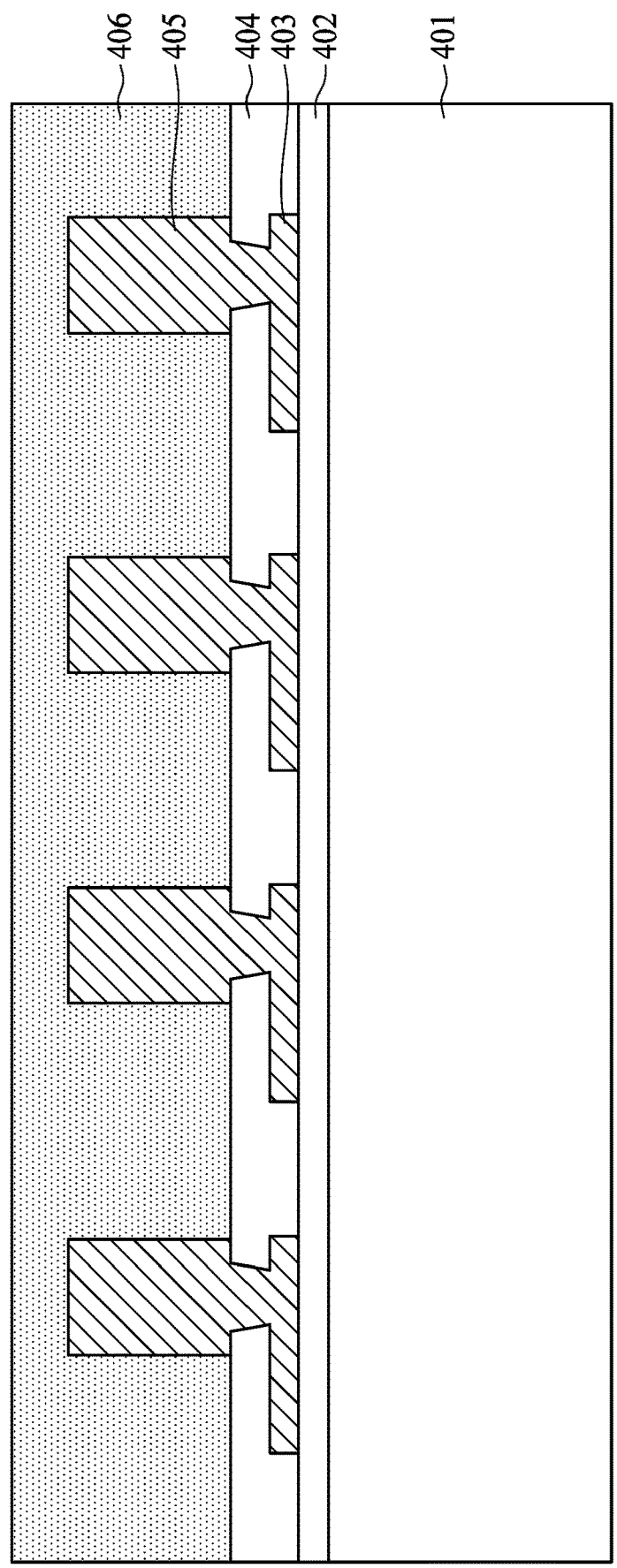

Referring to FIG. 4E, an encapsulant 406 (e.g., corresponding to the encapsulant 12e in FIG. 1) is then formed on a portion of the passivation layer 404. The encapsulant 406 may fully cover the metal pillar 405 (e.g., a top surface and lateral surfaces of the metal pillar 405). The encapsulant 406 may be formed by molding techniques, such as transfer molding, compression molding or any other suitable processes.

Figure 4F:
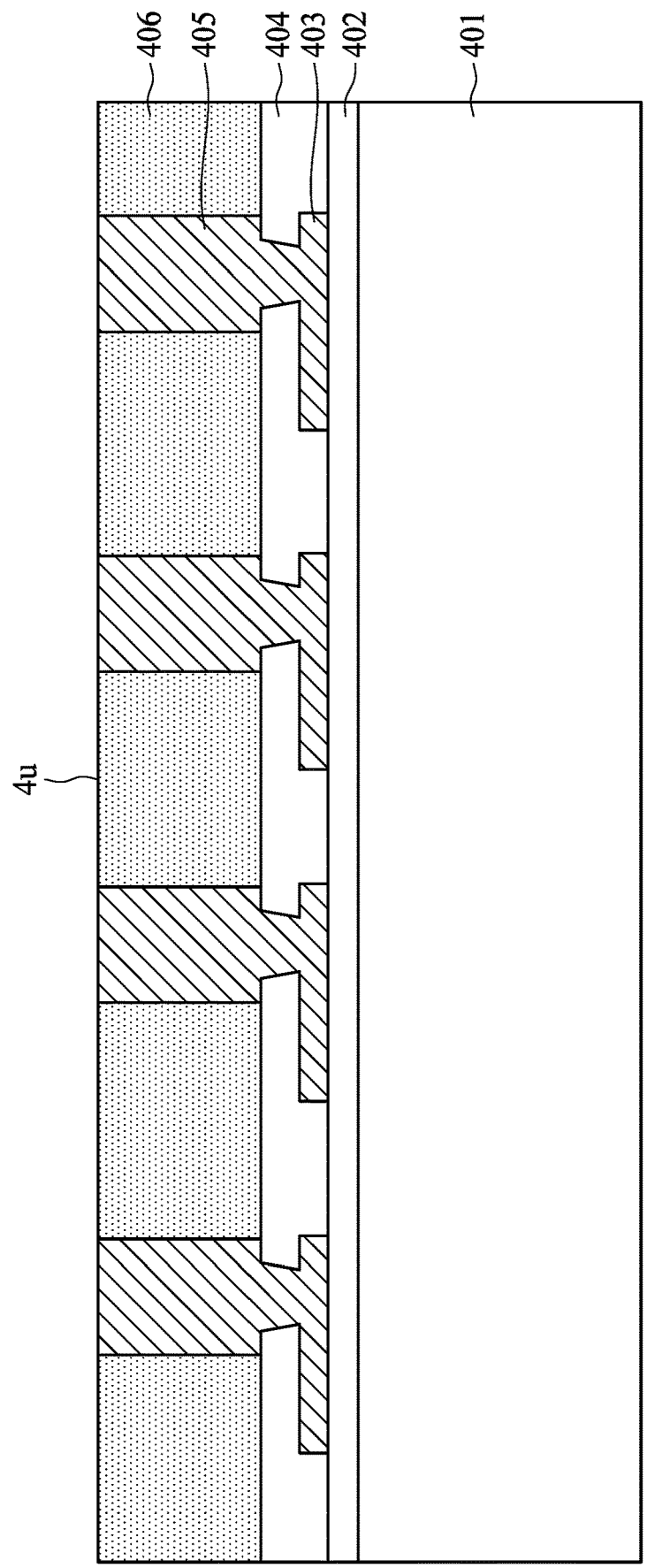

Referring to FIG. 4F, a portion of the encapsulant 406 is removed to expose the top surface 4u of the metal pillar 405. In some embodiments, a portion of the metal pillar 405 can be removed as well. In some embodiments, the encapsulant 406 can be removed by, for example, grinding or any other suitable processes. In this embodiment, the metal pillar 405 is formed first (as shown in FIG. 4D), the encapsulant 406 is then formed to cover the metal pillar 405 (as shown in FIG. 4E). In some other embodiments, the encapsulant 406 may be formed on the passivation layer 404 first, then the encapsulant is etched by laser to form a via. Then, the via is filled with conductive materials to form the metal pillar 405. The degree of engagement between the metal pillar 405 and the encapsulant 406 in the embodiment shown in FIG. 4D to 4F is better than the other embodiments described above.

Figure 4G:
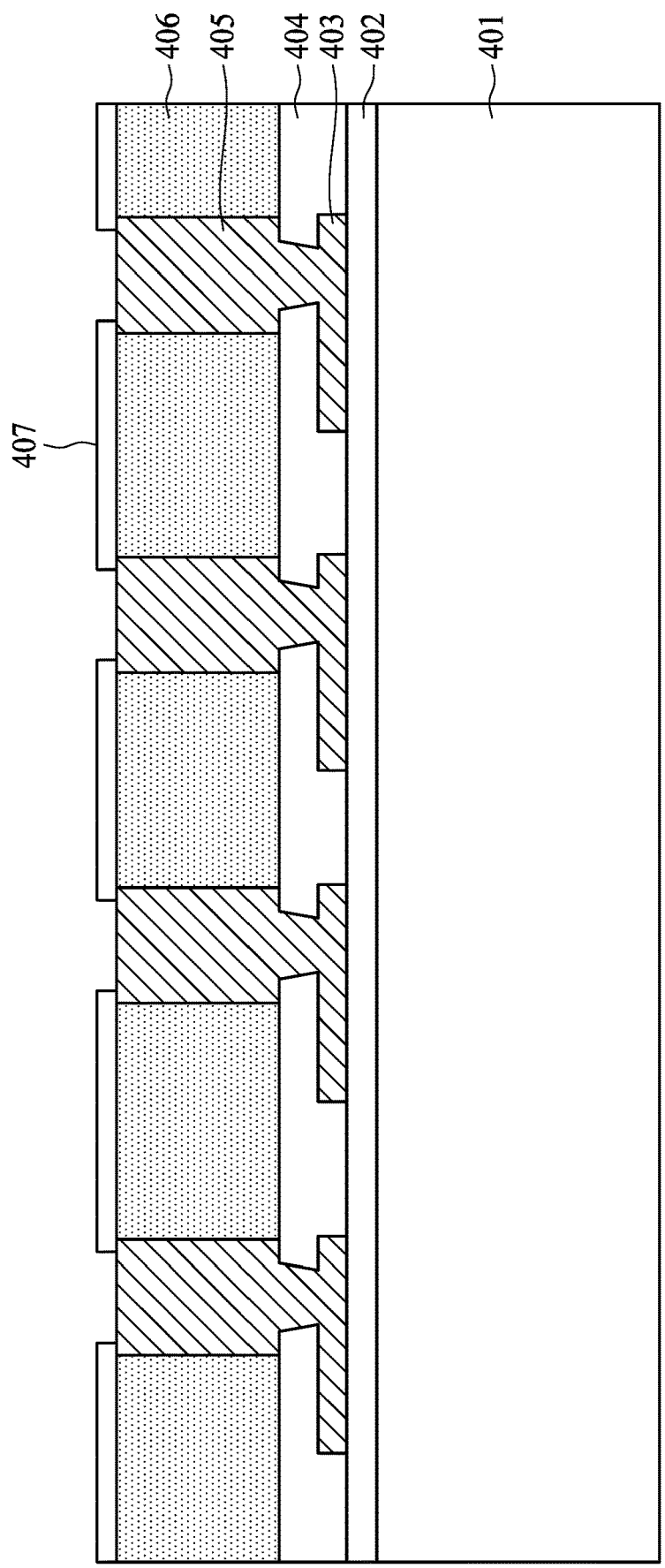

Referring to FIG. 4G, a passivation layer 407 is formed on the encapsulant 406 and a portion of the top surface 4u of the metal pillar 405. The passivation layer 407 has one or more openings to expose a portion of the top surface 4u of the metal pillar 405.

Figure 4H:
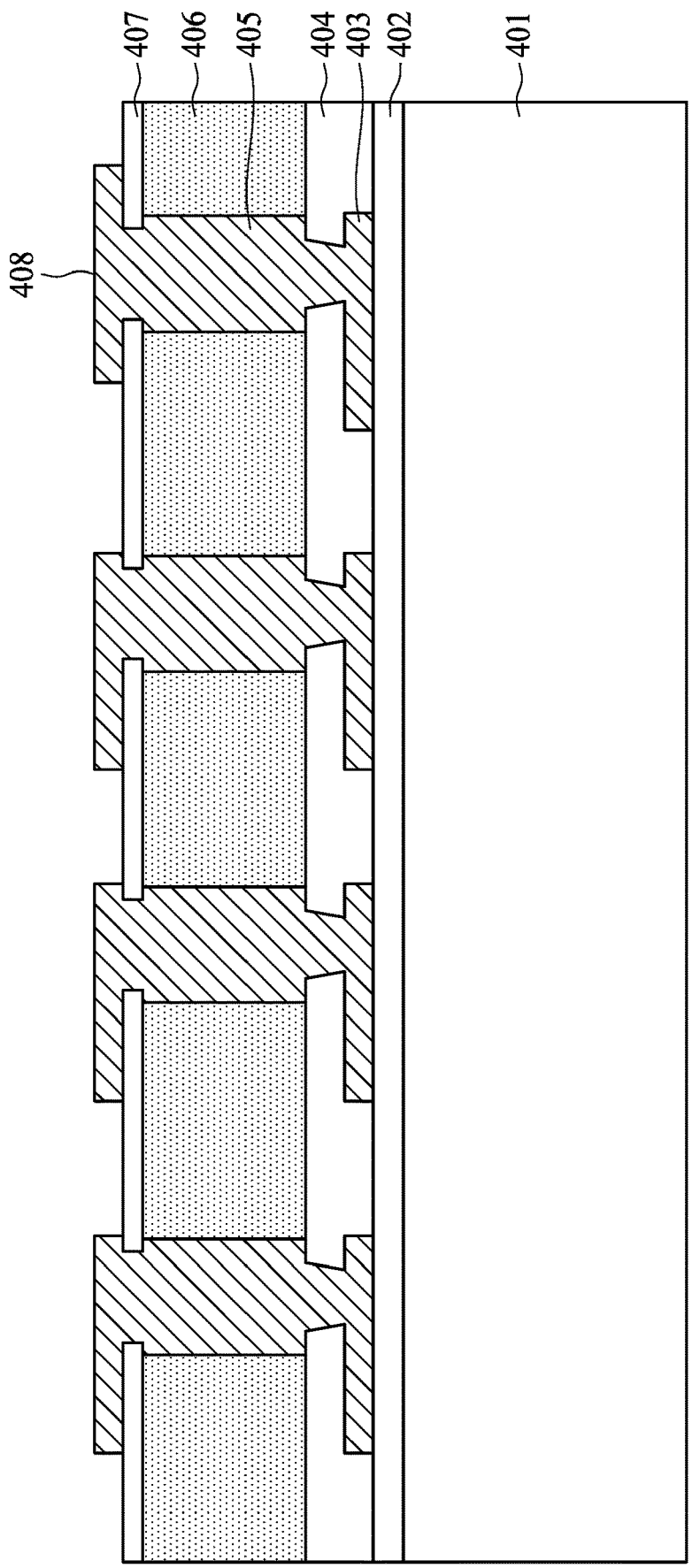

Referring to FIG. 4H, a RDL 408 (e.g., corresponding to the ground layer 12g in FIG. 1) is formed on the portion of the top surface 4u of the metal pillar 405 exposed from the passivation layer 407. The RDL 408 covers a portion of the passivation layer 407. The RDL 408 has one or more openings to expose a portion of the passivation layer 407.

Figure 4I:
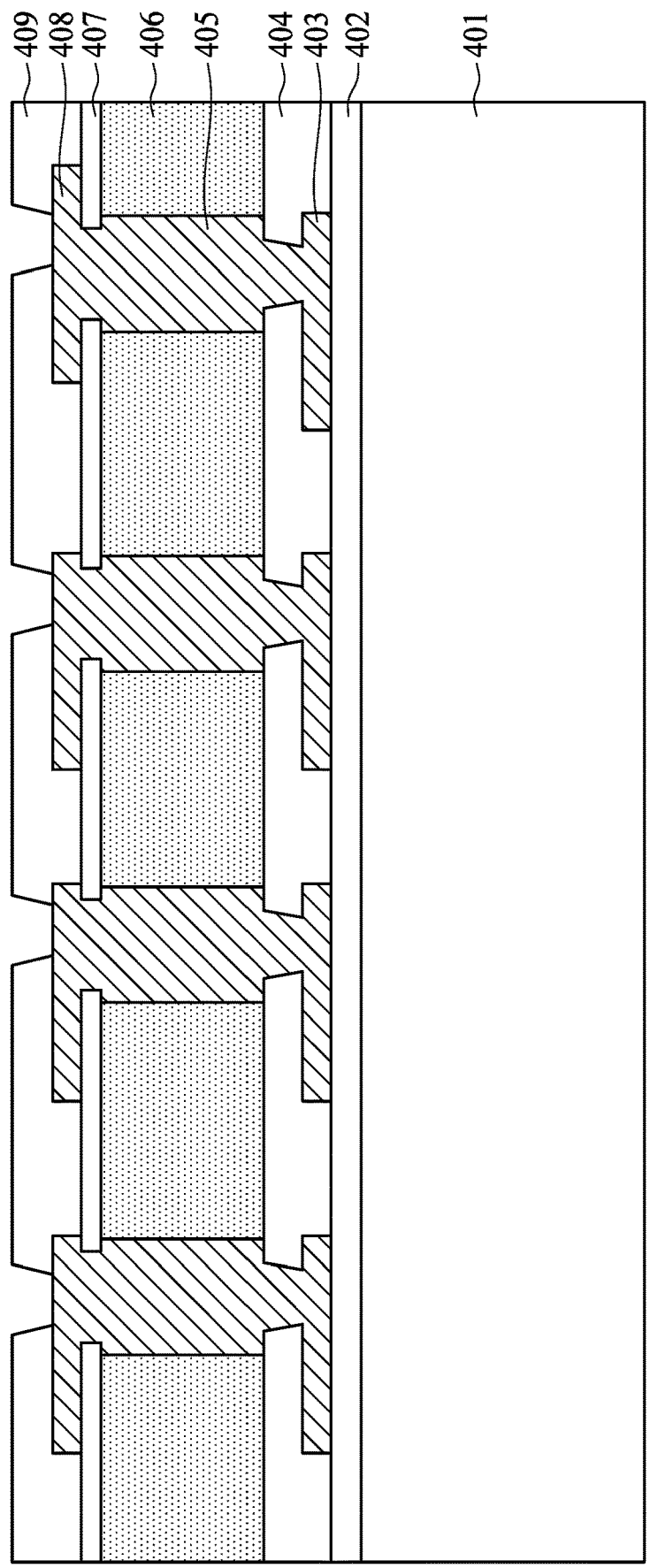
Figure 4J:
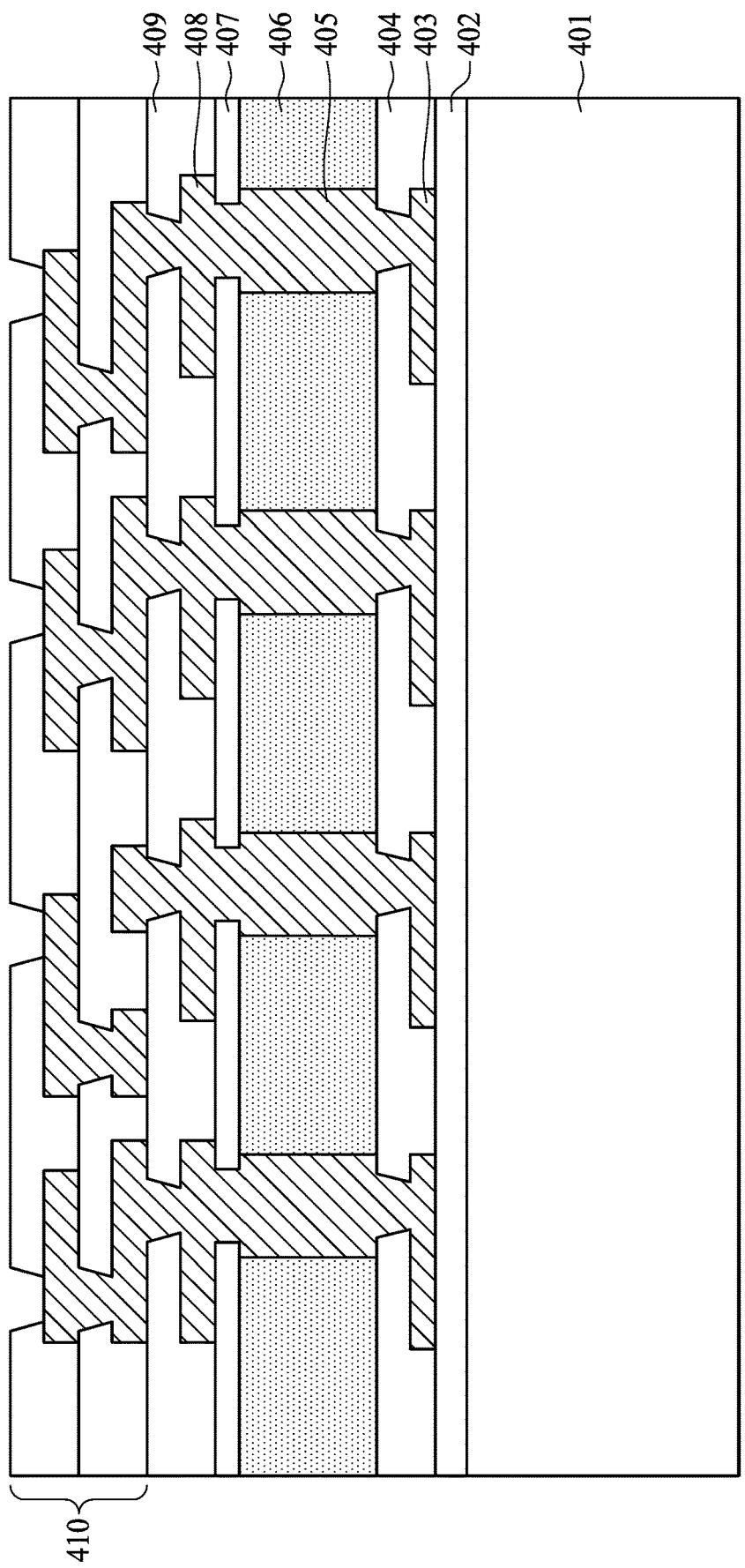

Referring to FIG. 4I, a dielectric layer 409 (e.g., corresponding to the dielectric layer 11d in FIG. 1) is formed on the RDL 408 and within the openings to contact the passivation layer 407 exposed from the RDL 408. The dielectric layer 409 has one or more openings to expose a portion of the RDL 408. Each of the openings of the dielectric layer 409 has a first surface in contact with the RDL 408 and a second surface opposite to the first surface. As shown in FIG. 4I, the width of the second surface is greater than the width of the first surface of the openings of the dielectric layer 409. Referring to FIG. 4J, multi-RDL layers 410 are formed. The top surface of the multi-RDL layers 410 have one or more openings.

Figure 4K:
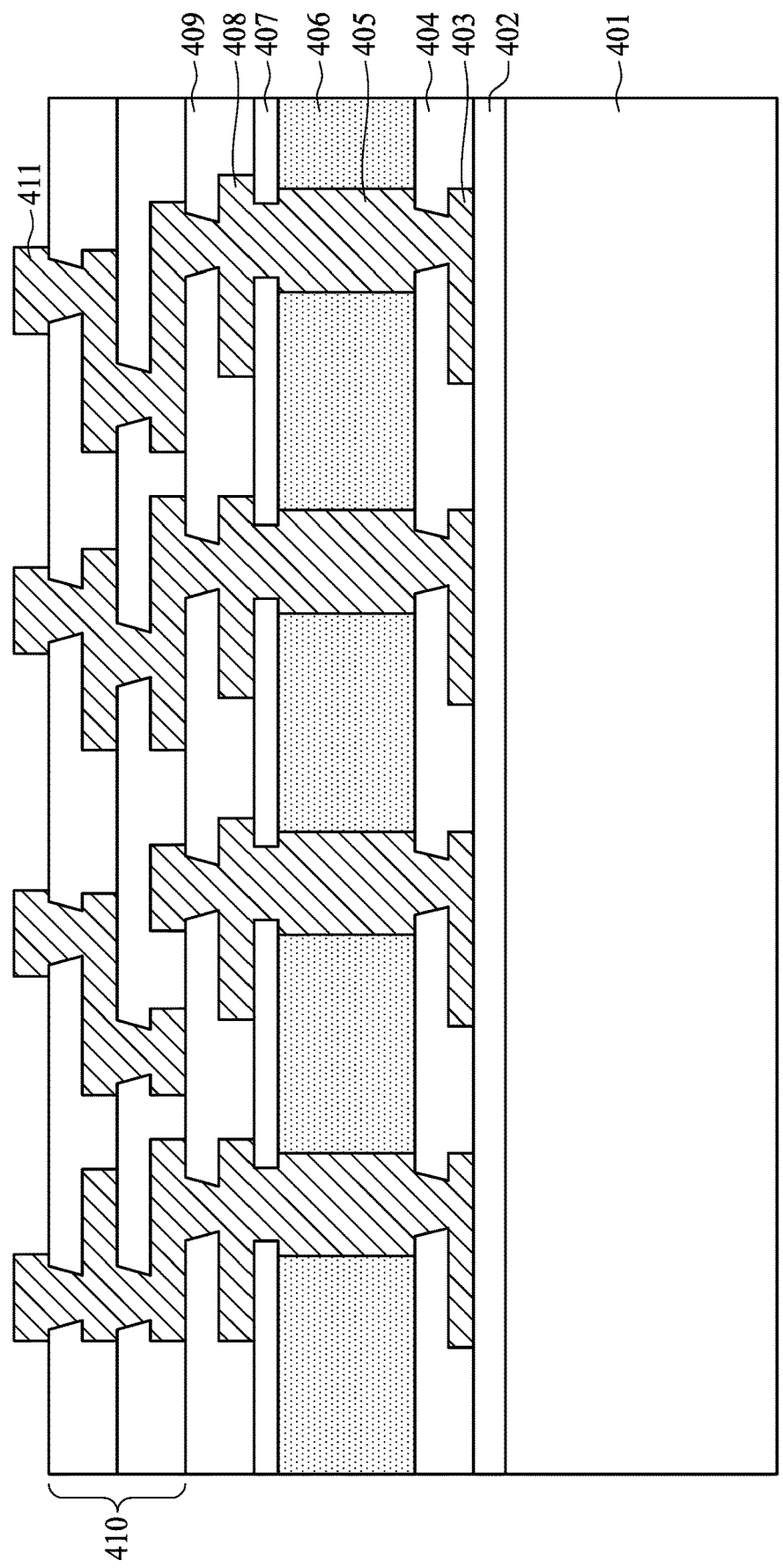
Figure 4L:
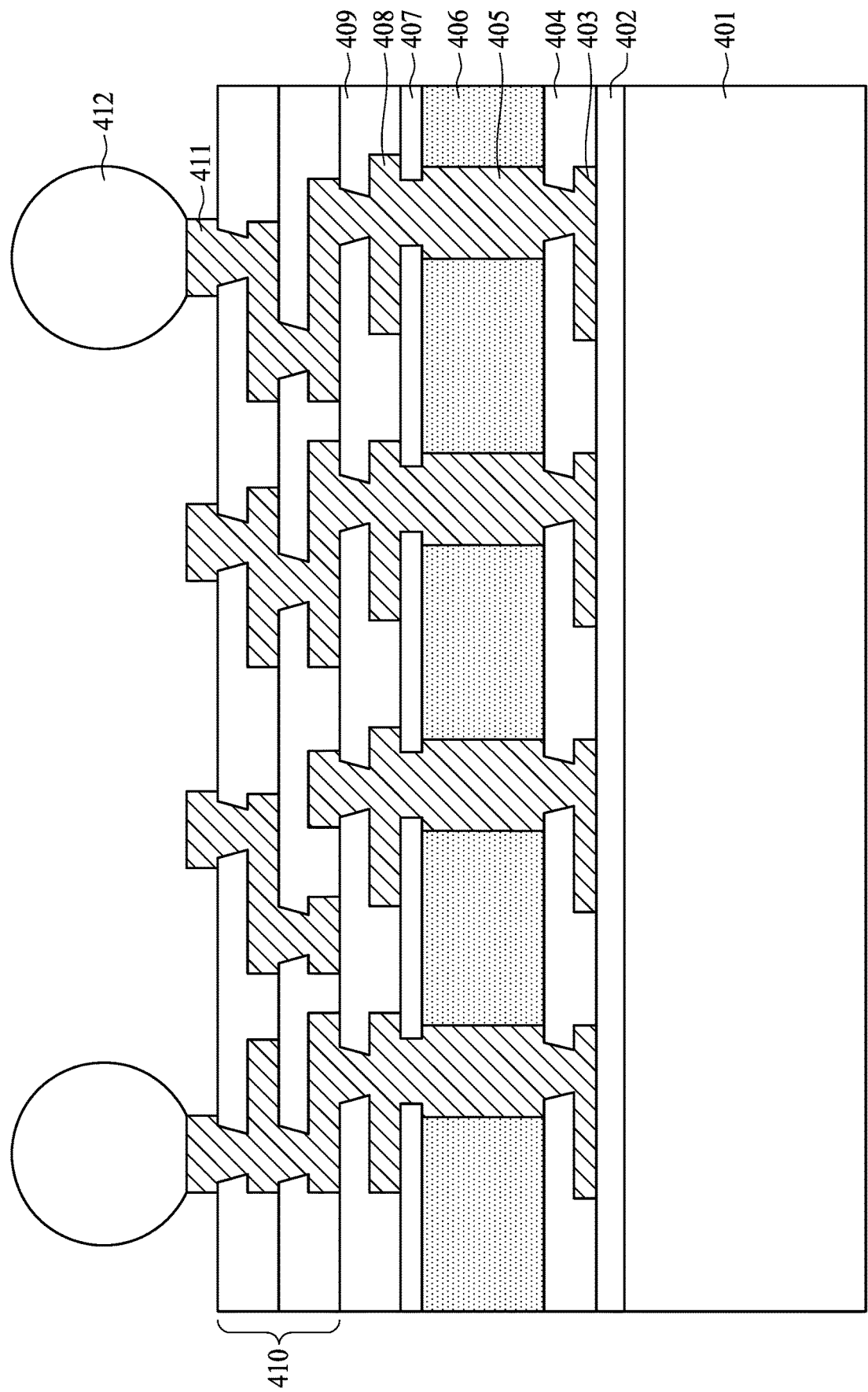
Figure 4M:
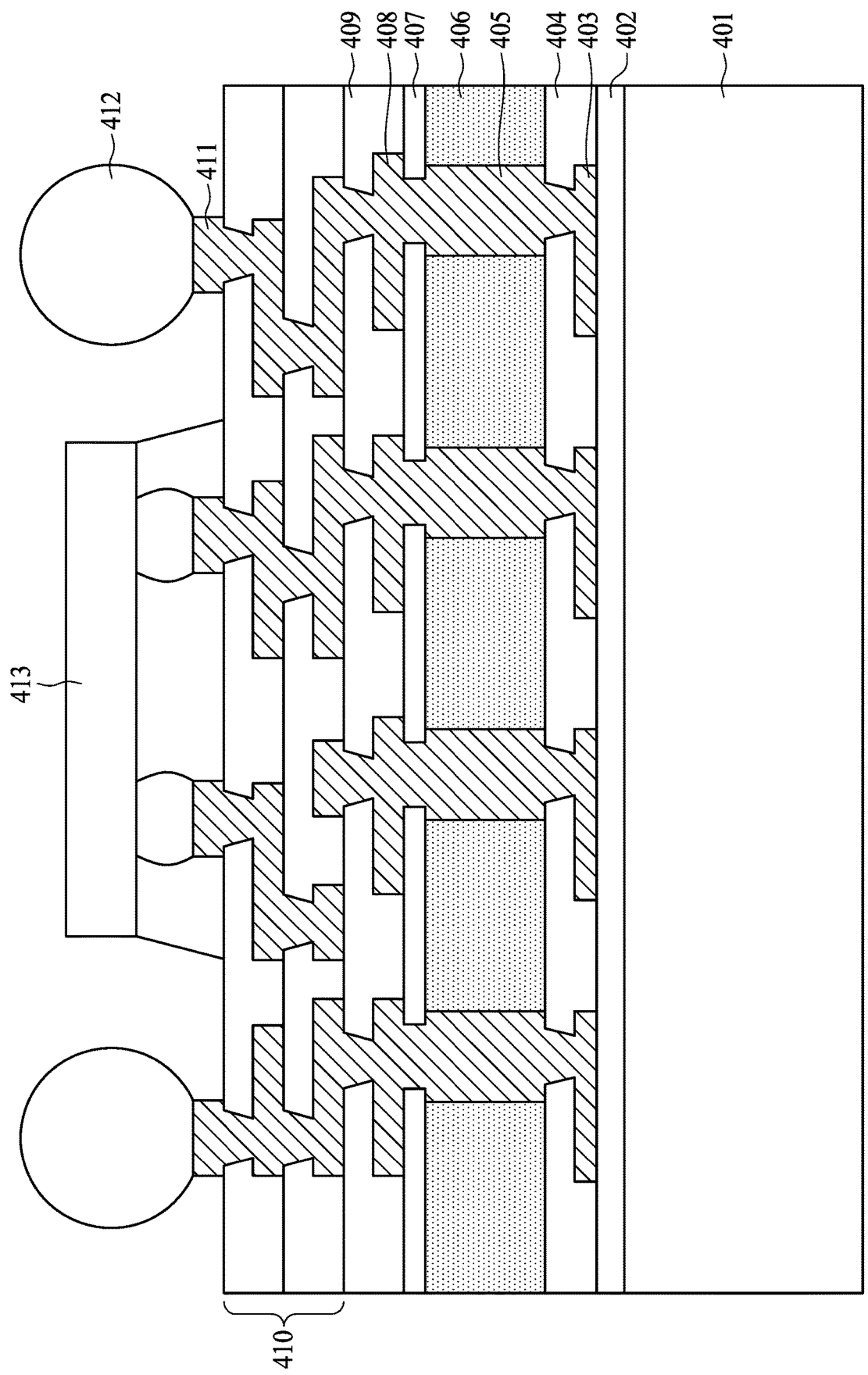
Figure 4N:
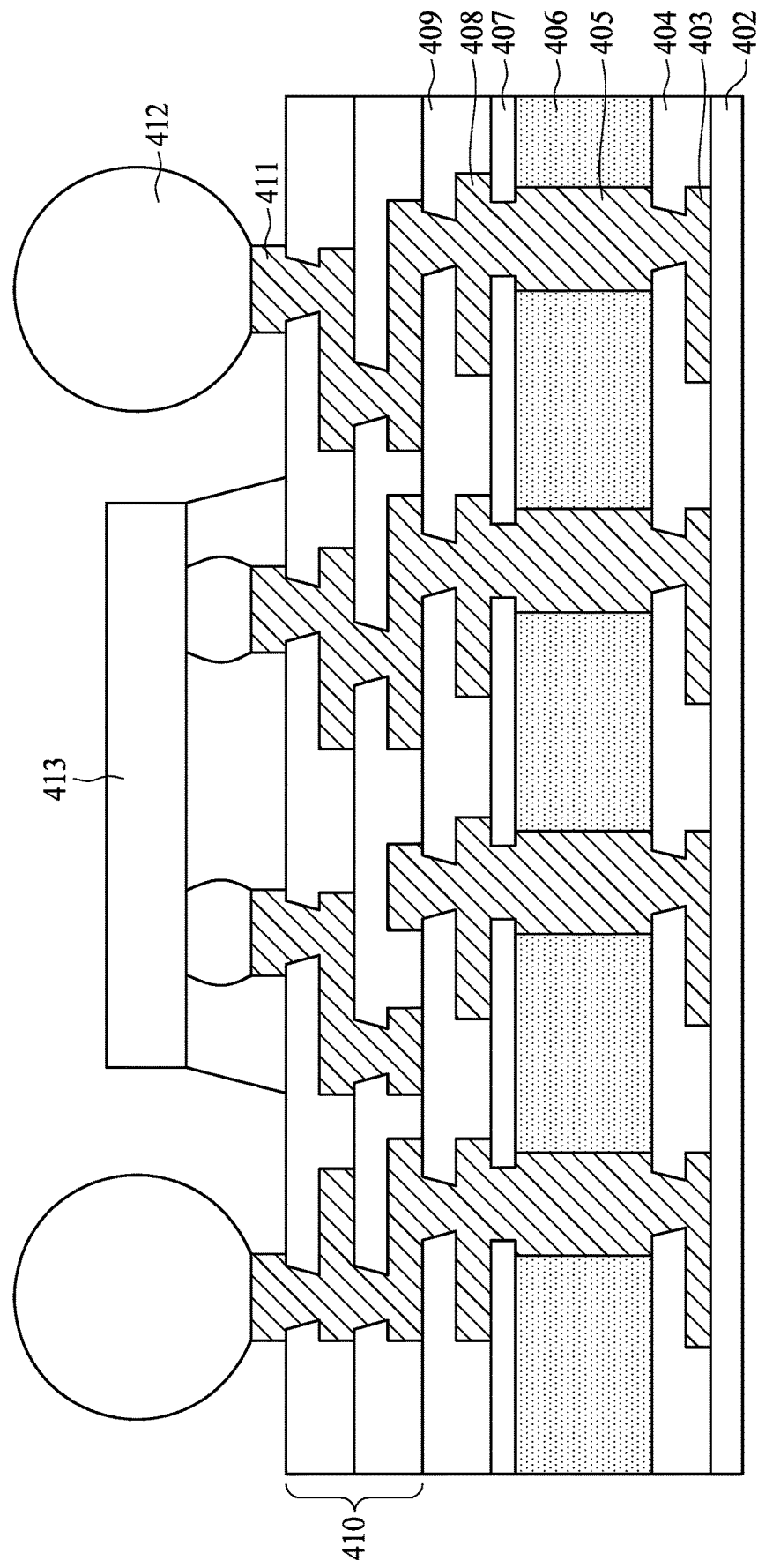

Referring to FIG. 4K, a pad 411 is formed on a portion of the top surface of the multi-RDL layers 410 and formed on the openings of the multi-RDL layers 410. Referring to FIG. 4L, an electrical contact 412 is disposed on the pad 411. In some embodiments, the electrical contact 412 includes a controlled collapse chip connection (C4) bump, a ball grid array (BGA) or a land grid array (LGA). Referring to FIG. 4M, an electronic component 413 (e.g., corresponding to the electronic component 13 in FIG. 1) is electrically connected to the multi-RDL layers 410. Referring to FIG. 4N, the carrier 401 is then removed to form the semiconductor device package 1 as shown in FIG. 1.

FIG. 5A, FIG. 5B, FIG. 5C, FIG. 5D and FIG. 5E illustrate a method for manufacturing a portion of a semiconductor device package in accordance with some embodiments of the present disclosure. In some embodiments, the method in FIG. 5A, FIG. 5B, FIG. 5C, FIG. 5D and FIG. 5E can be used to manufacture the structure 2 as shown in FIG. 2.

Figure 5A:
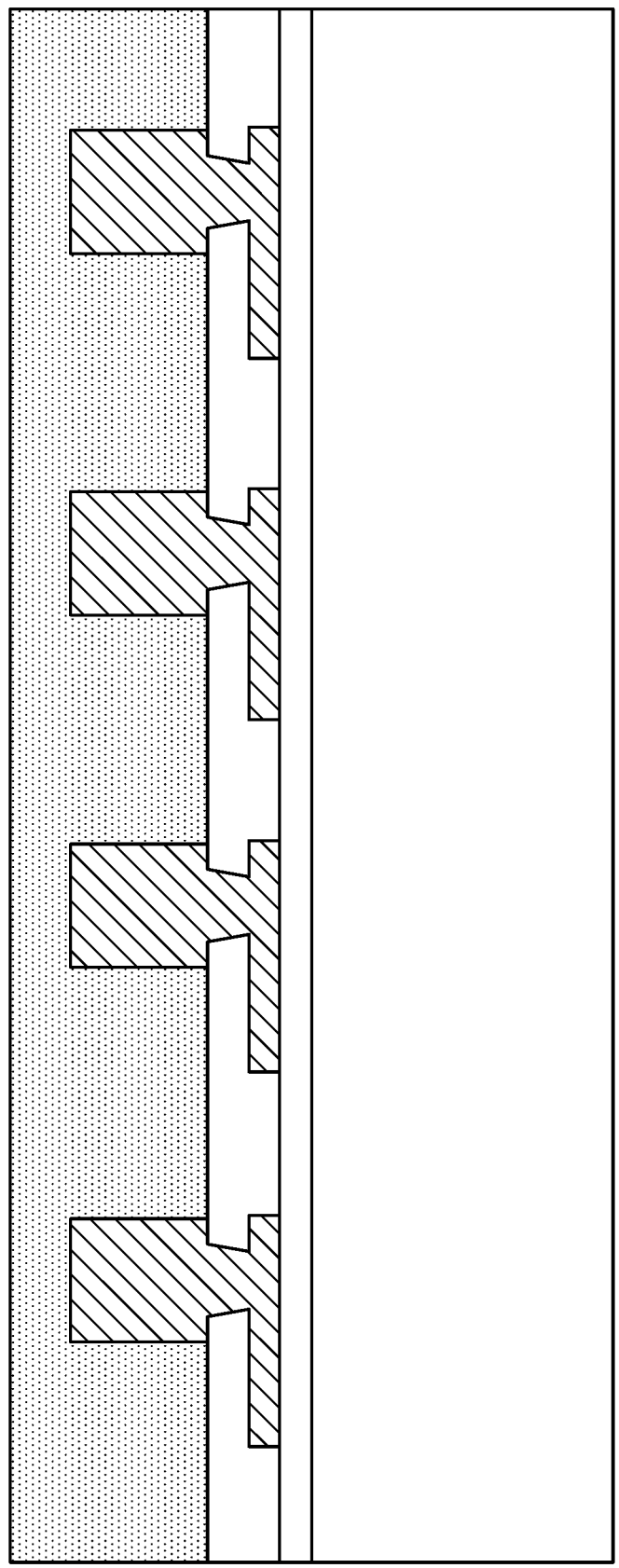
FIG. 5A, FIG. 5B, FIG. 5C, FIG. 5D and FIG. 5E illustrate a method for manufacturing a portion of a semiconductor device package in accordance with some embodiments of the present disclosure.

Referring to FIG. 5A, a structure 51 is provided. The structure 51 in FIG. 5A is the same as the structure shown in FIG. 4E, and thus the detail steps for forming the structure 51 is not repeated here.

Figure 5B:
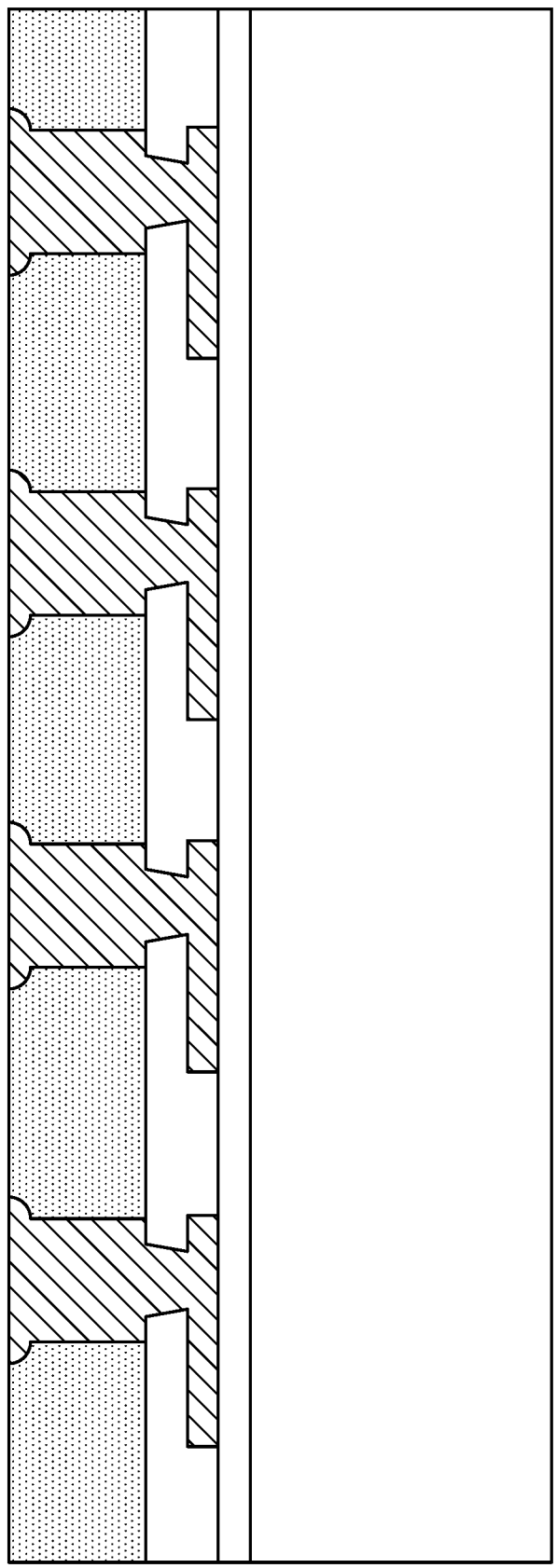

Referring to FIG. 5B, a portion of the encapsulant is removed to expose the top surface of the metal pillar. In some embodiments, the encapsulant can be removed by, for example, a grinding process, and thus the top surface of the metal pillar may be stretched. The stretched top surface of the metal pillar may cause a short circuit problem.

Figure 5C:
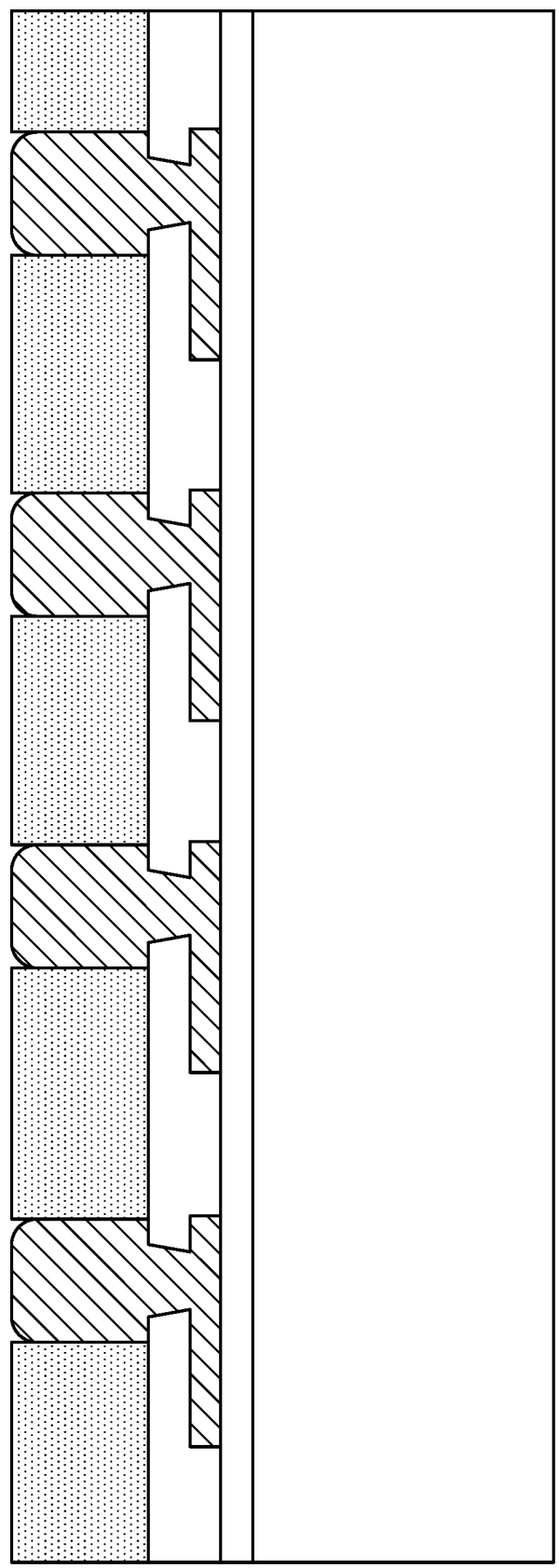

Referring to FIG. 5C, the top surface of the metal pillar is etched/micro-etched so as to remove the stretched top surface of the metal pillar and to form a gap between the encapsulant and the metal pillar. A portion of the top surface of the metal pillar after being etched has a curved surface. The top surface of the metal pillar after being etched is lower than the top surface of the encapsulant.

Figure 5D:
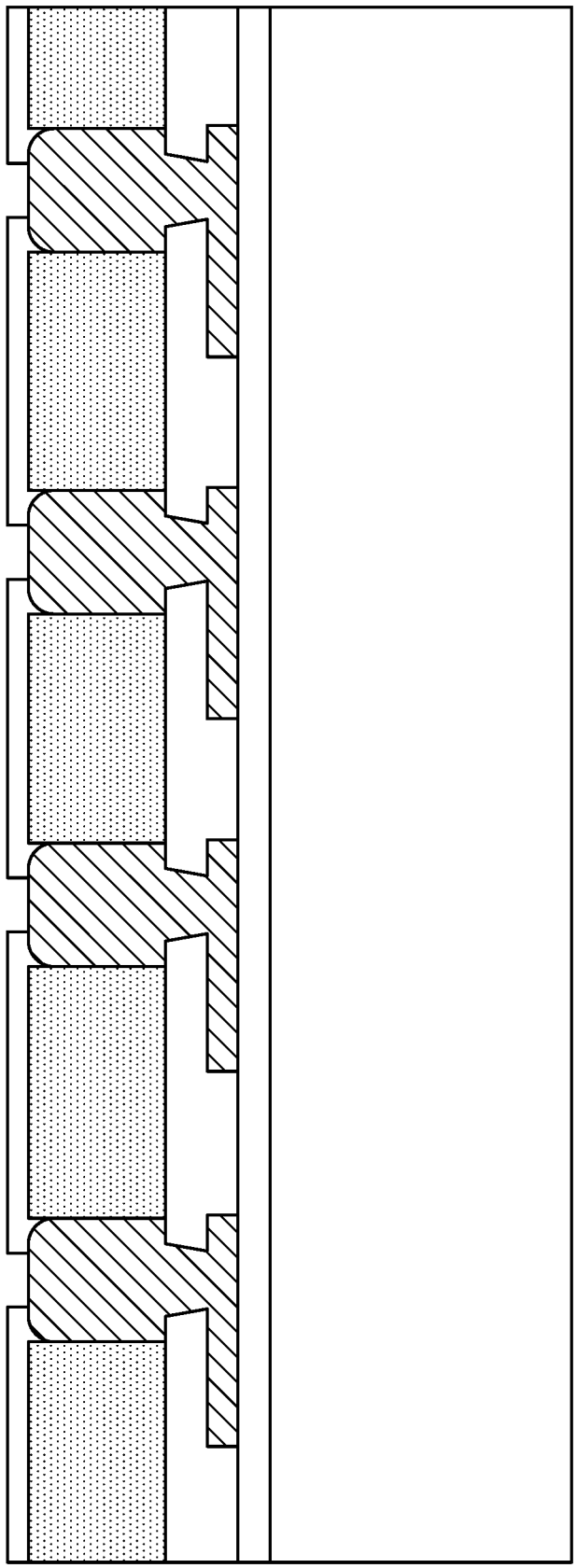
Figure 5E:
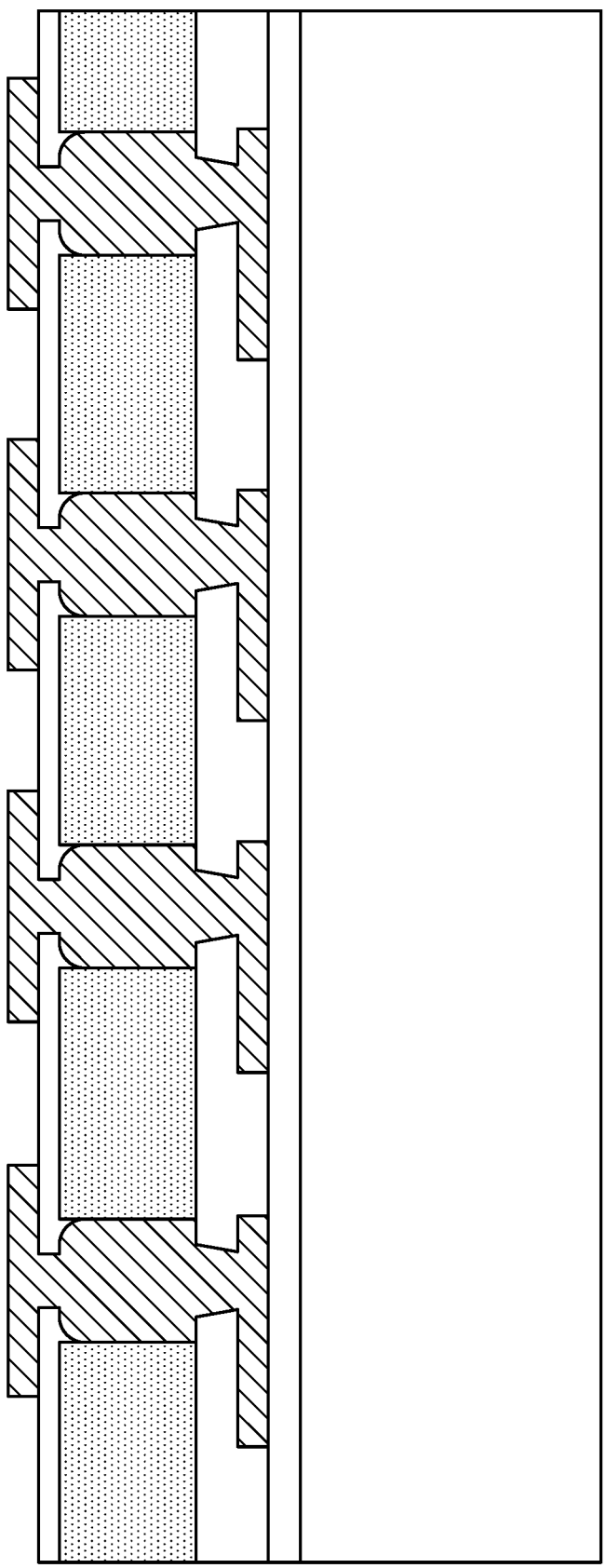

Referring to FIG. 5D, a passivation layer is formed on the encapsulant and a portion of the top surface of the metal pillar. The passivation layer has one or more openings to expose a portion of the top surface of the metal pillar. The passivation layer is filled into the gap in FIG. 5C. Referring to FIG. 5E, a RDL 408 is formed on the portion of the top surface of the metal pillar exposed from the passivation layer.

FIG. 6A, FIG. 6B, FIG. 6C and FIG. 6D illustrate a method for manufacturing a portion of a semiconductor device package in accordance with some embodiments of the present disclosure. In some embodiments, the method in FIG. 6A, FIG. 6B, FIG. 6C and FIG. 6D can be used to manufacture a protruding portion 12m of the semiconductor device package 3 as shown in FIG. 3.

Figure 6A:
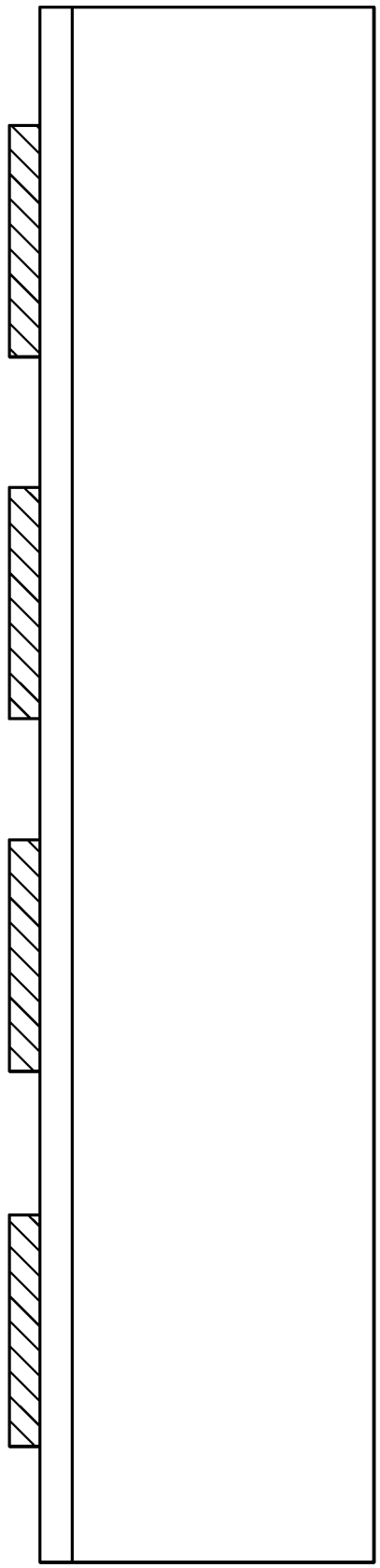
FIG. 6A, FIG. 6B, FIG. 6C and FIG. 6D illustrate a method for manufacturing a portion of a semiconductor device package in accordance with some embodiments of the present disclosure.

Referring to FIG. 6A, a structure 61 having a carrier 401, a passivation layer 402 and an antenna pattern layer 403 is provided. The structure 61 in FIG. 6A is the same as the structure shown in FIG. 4B, and thus the detail steps for forming the structure 61 is not repeated here.

Figure 6B:
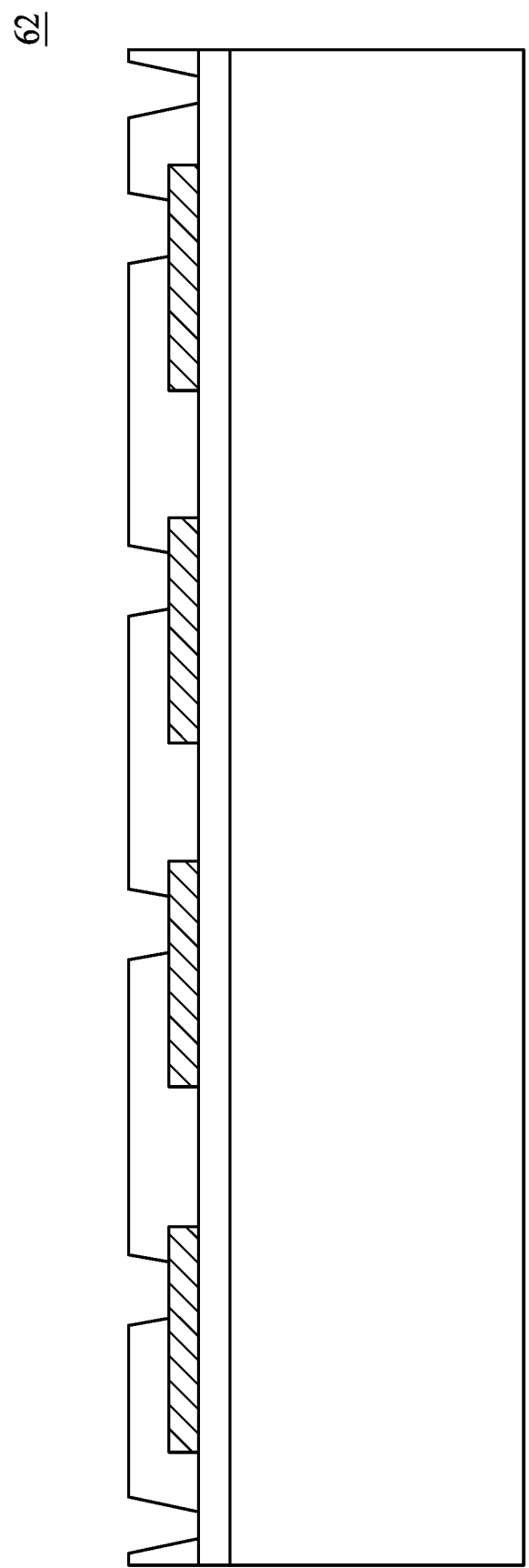

Referring to FIG. 6B, a passivation layer 404 is formed on the antenna pattern layer 403 and within the openings to contact the passivation layer 402 exposed from the antenna pattern layer 403. The passivation layer 404 has one or more openings to expose a portion of the antenna pattern layer 403 and to expose a portion of the passivation layer 402. As shown in FIG. 6B, the depth of the openings formed on the passivation layer 401 is greater than the depth of the openings formed on the antenna pattern layer 403. Each of the openings of the passivation layer 404 has a first surface in contact with or adjacent to the passivation layer 401 and a second surface opposite to the first surface. As shown in FIG. 4C, the width of the second surface is greater than the width of the first surface of the openings of the passivation layer 404.

Figure 6C:
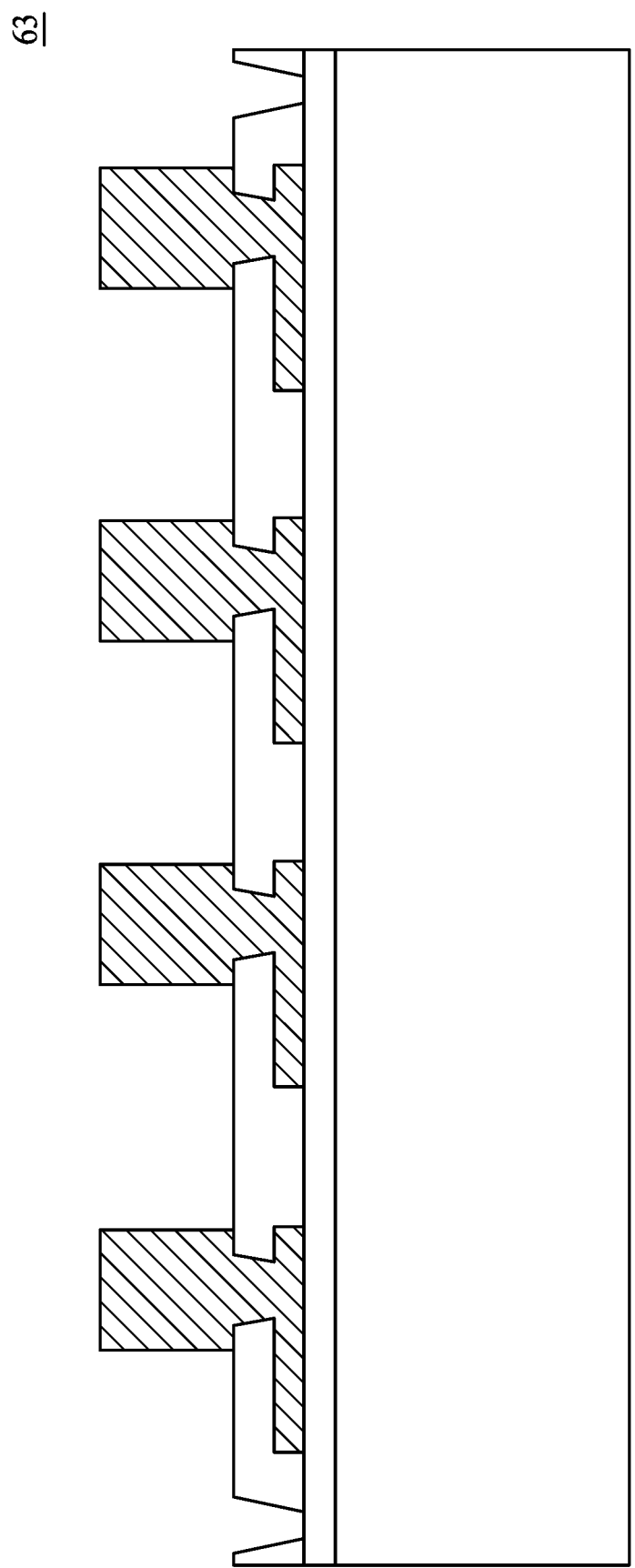

Referring to FIG. 6C, a metal pillar 405 (e.g., corresponding to the antenna metal pillar 12p in FIG. 1) is formed on the antenna pattern layer 403 exposed from the passivation layer 404.

Figure 6D:
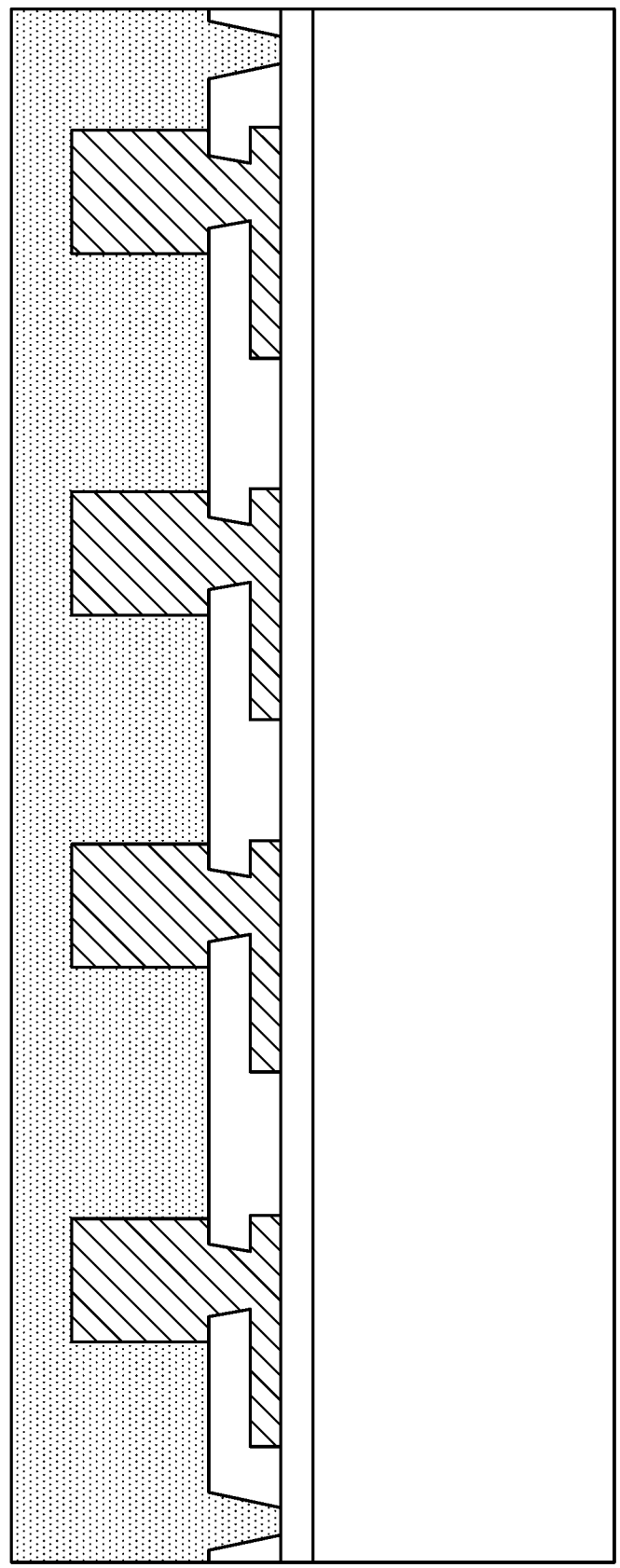

Referring to FIG. 6D, an encapsulant 406 (e.g., corresponding to the encapsulant 12e in FIG. 1) is then formed on a portion of the passivation layer 404 and a portion of the passivation layer 401 exposed from the openings of the passivation layer 404. The encapsulant 406 may fully cover the metal pillar 405 (e.g., a top surface and lateral surfaces of the metal pillar 405). The encapsulant 406 may be formed by molding techniques, such as transfer molding, compression molding or any other suitable processes.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm within 30 µm within 20 µm within 10 µm or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a circuit layer having a first surface, a second surface opposite to the first surface;
   an antenna module having an antenna pattern layer and disposed on the first surface of the circuit layer;
   a metal pillar electrically connected between the antenna pattern layer and the first surface of the circuit layer;
   a conductive via electrically connected between the antenna pattern layer and the metal pillar, wherein the conductive via tapers toward the antenna pattern layer; and
   an encapsulant covering at least a portion of a lateral surface of the metal pillar;
   wherein a passivation layer is disposed between the encapsulant and the antenna pattern layer.

2. The semiconductor device package of claim 1, wherein the antenna module further comprises a ground layer contacting the first surface of the circuit layer.

3. The semiconductor device package of claim 2, wherein the ground layer directly contacts the first surface of the circuit layer.

4. The semiconductor device package of claim 2, wherein the encapsulant is between the ground layer and the antenna pattern layer.

5. The semiconductor device package of claim 1, wherein the circuit layer further comprises a lateral surface extending between the first surface and the second surface, wherein the lateral surface of the circuit layer is substantially coplanar with a lateral surface of the antenna module.

6. The semiconductor device package of claim 1, wherein the passivation layer comprises a recess.

7. The semiconductor device package of claim 6, wherein the encapsulant has a surface facing away from the circuit layer and a protruding portion protruded from the surface of the encapsulant that facing away from the circuit layer.

8. The semiconductor device package of claim 6, wherein the antenna pattern layer is disposed in the recess of the passivation layer.

9. The semiconductor device package of claim 7, wherein the protruding portion is surrounded by the passivation layer.

10. The semiconductor device package of claim 7, wherein a width of the protruding portion proximal to the encapsulant is greater than a width of the protruding portion distal from the encapsulant.

11. The semiconductor device package of claim 1, wherein
   the metal pillar has a surface facing the circuit layer;
   the encapsulant has a surface facing the circuit layer; and
   a portion of the surface of the metal pillar is recessed from the surface of the encapsulant.

12. The semiconductor device package of claim 11, wherein the portion of the surface of the metal pillar has a curved surface.

13. The semiconductor device package of claim 11, wherein a gap is defined between the encapsulant and the metal pillar.

14. The semiconductor device package of claim 11, wherein the encapsulant has a recess from the surface of the encapsulant that facing the circuit layer.

15. The semiconductor device package of claim 13, wherein the antenna module further comprises a second passivation layer covering the encapsulant and the metal pillar, wherein the second passivation layer is disposed within the gap.

16. The semiconductor device package of claim 15, wherein the second passivation layer is between the metal pillar and the circuit layer.

17. The semiconductor device package of claim 15, wherein the second passivation layer has a lateral surface substantially coplanar with a lateral surface of the antenna module.

18. The semiconductor device package of claim 1, further comprising an electronic component disposed on the second surface of the circuit layer and electrically connected to the antenna module through an interconnection structure within the circuit layer.

19. The semiconductor device package of claim 1, wherein the passivation layer covers the encapsulant and the metal pillar.

20. A semiconductor device package, comprising:
- a circuit layer having a first surface, a second surface opposite to the first surface;
- an antenna module having an antenna pattern layer and disposed on the first surface of the circuit layer;
- a metal pillar electrically connected between the antenna pattern layer and the first surface of the circuit layer;
- an encapsulant covering at least a portion of a lateral surface of the metal pillar, wherein the encapsulant has a surface facing away from the circuit layer and a protruding portion protruded from the surface of the encapsulant; and
- a passivation layer disposed between the encapsulant and the antenna pattern layer, wherein the protruding portion is surrounded by the passivation layer.

21. The semiconductor device package of claim 20, wherein the passivation layer comprises a recess.

22. A semiconductor device package, comprising:
- a circuit layer having a first surface, a second surface opposite to the first surface;
- an antenna module having an antenna pattern layer and disposed on the first surface of the circuit layer;
- a metal pillar electrically connected between the antenna pattern layer and the first surface of the circuit layer; and
- an encapsulant covering at least a portion of a lateral surface of the metal pillar, wherein the encapsulant has a surface facing away from the circuit layer and a protruding portion protruded from the surface of the encapsulant;
- wherein a width of the protruding portion proximal to the encapsulant is greater than a width of the protruding portion distal from the encapsulant; and
- wherein a passivation layer is disposed between the encapsulant and the antenna pattern layer.

23. The semiconductor device package of claim 22, wherein the passivation layer comprises a recess.

* * * * *